United States Patent [19]

Stahlhofen et al.

[11] Patent Number: 4,594,306

[45] Date of Patent: Jun. 10, 1986

[54] LIGHT-SENSITIVE COPYING MATERIAL WITH O-QUINONE DIAZIDE AND PHENOLIC HYDROXY COMPOUND

[75] Inventors: Paul Stahlhofen, Wiesbaden; Rainer Beutel, Flörsheim, both of Fed. Rep. of Germany

[73] Assignee: Hoechst Aktiengesellschaft, Frankfurt am Main, Fed. Rep. of Germany

[21] Appl. No.: 641,424

[22] Filed: Aug. 17, 1984

Related U.S. Application Data

[63] Continuation of Ser. No. 151,543, May 20, 1980, abandoned, which is a continuation of Ser. No. 734,875, Oct. 22, 1976, abandoned.

[30] Foreign Application Priority Data

Oct. 25, 1975 [DE] Fed. Rep. of Germany ....... 2547905

[51] Int. Cl.$^4$ .......................... G03C 1/60; G03C 1/94; G03F 7/08
[52] U.S. Cl. .................................... 430/166; 430/165; 430/191; 430/192; 430/302
[58] Field of Search ............... 430/191, 192, 190, 320, 430/302, 166, 165

[56] References Cited

U.S. PATENT DOCUMENTS

| | | | |
|---|---|---|---|
| 2,859,112 | 11/1958 | Sus et al. | 430/192 |
| 3,046,115 | 7/1962 | Schmidt et al. | 430/193 |
| 3,061,430 | 10/1962 | Uhlig et al. | 430/193 |
| 3,102,809 | 9/1963 | Endermann et al. | 430/193 |
| 3,106,465 | 10/1963 | Neugebauer et al. | 430/193 |
| 3,130,049 | 4/1964 | Neugebauer et al. | 430/192 |
| 3,148,983 | 9/1964 | Endermann et al. | 430/193 |
| 3,180,733 | 4/1965 | Neugebauer et al. | 430/302 |
| 3,264,104 | 8/1966 | Reichel | 430/192 |
| 4,009,033 | 2/1977 | Bakus et al. | 430/192 |

OTHER PUBLICATIONS

Dinaburg, *Photosensitive Diazo Compounds and Their Uses,* The Focal Press, 1964, pp. 182-192.

*Primary Examiner*—Charles L. Bowers, Jr.
*Attorney, Agent, or Firm*—Schwartz, Jeffery, Schwaab, Mack, Blumenthal & Evans

[57] ABSTRACT

This invention relates to an improvement in a light-sensitive copying material comprising a carrier and a light-sensitive copying layer which contains, as the light-sensitive compound, an o-quinone diazide sulfonic acid ester or an o-quinone diazide sulfonic acid amide, the improvement being that the layer also contains a compound with an aromatic or aliphatic hydroxy group which is capable of forming chelate compounds.

3 Claims, No Drawings

LIGHT-SENSITIVE COPYING MATERIAL WITH O-QUINONE DIAZIDE AND PHENOLIC HYDROXY COMPOUND

This application is a continuation of application Ser. No 151,543, filed May 20, 1980, abandoned, which is a continuation of application Ser. No. 734,875, filed Oct. 22, 1976, abandoned.

The present invention relates to a light-sensitive copying material which comprises a carrier and a positive-working light-sensitive copying layer and which may be used for the production of planographic printing forms.

Generally, metallic carriers, preferably aluminum carriers, are used for the production of materials of this type. In practice, layers containing o-quinone diazides as the light-sensitive compound are preferred as positive-working copying layers.

Although layers of this type yield useful results even if they are applied to untreated aluminum, the aluminum surface is normally roughened by a mechanical, chemical, or electrochemical process before applying the copying layer. In most cases, this results in a considerable improvement of the adhesion of the unexposed layer, and, consequently, in an improved resistance to developer solutions and the production of longer printing runs. A further improvement of these properties may be achieved by anodization of the possibly previously roughened aluminum surface.

Further, similar improvements are obtained by treating the surface with alkali silicates, polyvinyl phosphonic acids, fluorophosphates, fluorozirconates, fluoro silicates, or similar compounds. Normally, however, the last mentioned types of treatment are suitable only for improving the adhesion of negative-working layers, in which, vice versa, the adhesion of the exposed areas of the layer requires improvement and the solubility of the unexposed areas must not be impaired.

U.S. Pat. No. 3,300,309, discloses a method for improving the moisture sensitivity of negative-working layers based on water-soluble diazonium salts, wherein the diazonium salts are used in the form of complex reaction products formed with certain aromatic hydroxy compounds.

It is the object of the present invention to provide a positive-working light-sensitive copying material the unexposed areas of which have an improved adhesion to the carrier during development and possibly also during further processing and printing.

The present invention is based on a light-sensitive copying material comprising a carrier and a light-sensitive copying layer which contains, as the light-sensitive compound, either an o-quinone diazide sulfonic acid ester or an o-quinone diazide sulfonic acid amide.

The layer further contains a compound with an aromatic or aliphatic, preferably phenolic or enolic, hydroxy group which is capable of forming chelate compounds.

Particularly suitable hydroxy compounds capable of forming chelate compounds are, above all, compounds with phenolic hydroxy groups which comprise at least two aromatic rings and which carry, attached to a carbon atom adjacent the aromatic carbon atom carrying the hydroxy group, a carbonyl group or a trivalent nitrogen atom all the valences of which are coplanar. The latter requirement is met by trivalent nitrogen atoms which possess either a substantially localized double bond or form part of a heterocyclic aromatic ring. Double-bonded nitrogen atoms in particular may be present in the form of an azo group.

By intramolecular hydrogen bridge formation between the hydroxy group and a nucleophilic group in the molecule, especially a carbonyl group or a trivalent nitrogen, the preferred chelating phenolic or enolic hydroxy compounds are capable of forming 5- or 6-membered rings, such as occur analogously in the formation of chelate compounds with metal cations.

Among these compounds, polyhydroxy benzophenones, especially the 2,3,4-trihydroxy-benzophenone, hydroxy anthraquinones, especially the 1,2-dihydroxy and the 1,2,4-trihydroxy-anthraquinone, and 8-hydroxyquinoline are particularly effective.

Examples of suitable compounds are aliphatic and aromatic hydroxy carbonyl compounds, hydroxy carboxylic acids, polycarbonyl compounds containing hydroxy groups, and nitrogen compounds containing hydroxy and possibly also carboxy groups. Of these, the following are particularly pointed out: purpurogallin, quercetin, glycolic acid, levulinic acid, salicylic acid, acetonyl acetone, 2,4-dihydroxyazobenzene, 8-hydroxy-quinoline, 4,8-dihydroxy-quinoline-2-carboxylic acid, 2,3,4-trihydroxy-benzophenone, 1,4-dihydroxyanthraquinone, 8-hydroxy-anthraquinone, 1,2,4-trihydroxy-anthraquinone, 2,4-dihydroxy-benzophenone, 1,2-dihydroxy-anthraquinone, and 1,2,5,8-tetrahydroxy-anthraquinone.

The concentration of the hydroxy compounds in the light-sensitive copying layer may vary within relatively wide limits; normally, it is between 0.3 and 15 percent by weight, calculated on the weight of the solid components of the layer, and preferably between 0.5 and 5 percent by weight.

As the light-sensitive compounds, the copying layers according to the invention contain o-quinone diazide compounds, especially o-naphthoquinone-diazide compounds, for example those disclosed in German Patent Nos. 854,890, 865,109, 879,203, 894,959, 938,233, 1,109,521, 1,114,705, 1,118,606, 1,120,273, and 1,124,817.

Further, the copying layers may include resins, in a manner known per se, for example resins containing groups which render them alkali-soluble, such as phenol resins, preferably novolaks, copolymers containing carboxylic groups, maleinate resins, or polyacrylic acid resins, further dyestuffs, plasticizers, and other conventional additives and adjuvants.

Metal supports, preferably aluminum supports, are used as carriers for the copying layers according to the invention.

The carriers are coated in known manner, for example by roller application, by immersion, by spraying, or by casting.

The planographic printing plates according to the present invention have the advantage that their preparation is very simple because it is not necessary to provide an intermediate layer between the carrier and the light-sensitive copying layer in order to improve adhesion. It is apparent that the application of an adhesive layer requires an additional working step, and normally, the desired optimum effect can be achieved only by a complicated process comprising several stages. If desired, however, the properties of the inventive printing plates may be further improved by forming anodically produced oxide layers on the carriers.

The planographic printing plates according to the present invention have the advantage that, due to the improved anchoring of the copying layer on the aluminum carrier, substantially longer printing runs can be printed on conventional offset printing machines than in the case of similar copying layers containing no hydroxy compounds. As a further advantage, the resistance of these layers towards chemical substances, especially to the alkaline developers normally used for removing the image-free areas after the usual imagewise exposure, is substantially improved.

The invention will be further illustrated by reference to the following specific examples:

EXAMPLE 1

0.90 p.b.w. of the esterification product of 1 mole of 2,4-dihydroxy-benzophenone and 2 moles of naphthoquinone-(1,2)-diazide-(2)-5-sulfonic acid chloride,
0.70 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
5.70 p.b.w. of a novolak (softening point 112°–119° C., 14 percent by weight of phenolic OH groups),
0.06 p.b.w. of 2,3,4-trihydroxy-benzophenone,
0.15 p.b.w. of Crystal Violet, and
0.08 p.b.w. of Sudan Yellow GGN (C.I. 11,021)
are dissolved in a solvent mixture composed of
80.00 p.b.w. of ethyleneglycol monomethyl ether, and
15.00 p.b.w. of butyl acetate,
and the resulting solution is coated onto an aluminum plate which has been roughened by brushing.

For the preparation of a printing form, the resulting printing plate is exposed under a positive transparency and developed, in known manner, with the following solution:
5.3 p.b.w. of sodium metasilicate.9H$_2$O,
3.4 p.b.w. of sodium orthophosphate.12H$_2$O
0.3 p.b.w. of sodium dihydrogen phosphate (anhydrous), and
91.0 p.b.w. of water,
the exposed areas of the layer being thus removed. The printing form produced in this manner may be used for printing about 40,000 flawless copies in an offset machine.

A printing form prepared in the same manner, except that the 2,3,4-trihydroxy-benzophenone was omitted from the coating solution, yields a run of about only 25,000 copies.

The difference in the resistance to chemicals becomes particularly apparent if the exposed printing plate is treated for a relatively long time with the alkaline developer in the absence of light. Whereas the printing form containing no trihydroxy benzophenone shows signs of strong corrosion, especially in the screened areas of the layer, after a 5 minutes' bathing in the developer solution at 25° C., the corresponding printing form containing the complex former shows no damage, in particular no tapering of the screen dots, even after a 20 minutes' stay in the developer bath under otherwise identical test conditions.

In the following Examples 2 to 5, the procedure used in Example 1 is repeated, and similar results are obtained after exposure and development of the resulting light-sensitive printing plates. Therefore, only the composition of the coating solution and the type of carrier used are stated in most of the following examples.

EXAMPLE 2

2.4 p.b.w. of the esterification product of 1 mole of 2,4-dihydroxy-benzophenone and 2 moles of naphthoquinone-(1,2)-diazide-(2)-5-sulfonic acid chloride,
4.8 p.b.w. of the novolak used in Example 1, and
0.06 p.b.w. of 8-hydroxy-quinoline
are dissolved in a solvent mixture composed of
35.0 p.b.w. of ethylene glycol monomethyl ether,
50.0 p.b.w. of tetrahydrofuran, and
10.0 p.b.w. of butyl acetate.
The resulting solution is coated onto the carrier used in Example 1 and dried. Exposure and development are as in Example 1, and similar results are obtained.

EXAMPLE 3

Coating solution:
0.80 p.b.w. of the p-cumyl phenol ester of naphthoquinone-(1,2)-diazide-(2)-4-sulfonic acid,
0.70 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
6.00 p.b.w. of the novolak used in Example 1,
0.05 p.b.w. of Crystal Violet,
0.03 p.b.w. of Sudan Yellow GGN (C.I. 11,021), and
0.10 p.b.w. of 1,2,4-trihydroxy-anthraquinone
95.0 p.b.w. of the solvent mixture used in Example 2.
The procedure is the same as in Example 1, and the results achieved are similar.

EXAMPLE 4

Coating solution:
2.4 p.b.w. of the esterification product of 1 mole of 2,4-dihydroxy-benzophenone and 2 moles of naphthoquinone-(1,2)-diazide-(2)-5-sulfonic acid chloride,
4.8 p.b.w. of the novolak used in Example 1, and
0.1 p.b.w. of purpurogallin,
in
95.0 p.b.w. of the solvent mixture used in Example 2.
The solution is applied to an electrolytically roughened and anodized aluminum foil. The further procedure is as in Example 1.

EXAMPLE 5

Coating solution:
0.80 p.b.w. of the esterification product of 1 mole of 2,3,4-trihydroxy-benzophenone and 3 moles of naphthoquinone-(1,2)-diazide-(2)-5-sulfonic acid chloride,
0.70 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
6.00 p.b.w. of a novolak with a softening range between 105° and 120° C.,
0.13 p.b.w. of Crystal Violet,
0.07 p.b.w. of Sudan Yellow GGN (C.I. 11,021), and
0.30 p.b.w. of quercetin,
in
95.00 p.b.w. of the solvent mixture used in Example 2.
The solution is applied to the carrier used in Example 4 and dried. The further procedure is as described in Example 1.

EXAMPLE 6

Coating solution:

0.50 p.b.w. of the esterification product of 1 mole of 2,4-dihydroxy-benzophenone and 2 moles of naphthoquinone-(1,2)-diazide-(2)-5-sulfonic acid chloride, 0.60 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride, 0.45 p.b.w. of naphthoquinone-(1,2)-diazide-(2)-4-sulfonic acid chloride, 5.00 p.b.w. of the novolak used in Example 1, 0.25 p.b.w. of an epoxy resin having an epoxy equivalent weight of 450 to 500 and a melting range of 64° to 74° C. (Durran Hg method), 0.10 p.b.w. of Crystal Violet, 0.55 p.b.w. of phosphoric acid tri-($\beta$-chloroethyl)-ester, and 0.15 p.b.w. of salicylic acid, in 95.0 p.b.w. of the solvent mixture used in Example 2.

The solution is applied to the carrier used in Example 4 and dried. Further processing is as in Example 1.

It will be obvious to those skilled in the art that many modifications may be made within the scope of the present invention without departing from the spirit thereof, and the invention includes all such modifications.

What is claimed is:

1. A light-sensitive copying material comprising (A) an anodized aluminum support and (B) a positive-working, light-sensitive copying layer immediately adjacent to said support, said copying layer containing (i) an alkali-soluble resin, (ii) one selected from the group consisting of an o-quinone diazide sulfonic acid ester and an o-quinone diazide sulfonic acid amide; and (iii) at least one phenolic hydroxy compound selected from the group consisting of 8-hydroxy-quinoline, 2,3,4-trihydroxy-benzophenone and 1,2,4-trihydroxy-anthraquinone, said phenolic hydroxy compound being present in said copying layer in an amount between about 0.3 and 15 weight-percent, based on the weight of solid components in said copying layer.

2. Copying material according to claim 1, wherein said alkali-soluble resin comprises a novolak.

3. Copying material as claimed in claim 1, wherein said phenolic hydroxy compound is 2,3,4-trihydroxybenzophenone.

* * * * *